United States Patent [19]
Toyoshima

[11] 3,939,425
[45] Feb. 17, 1976

[54] NOISE-SQUELCHING CIRCUIT USING A PHASE-LOCKED LOOP

[75] Inventor: Masakatsu Toyoshima, Tokyo, Japan

[73] Assignee: Sony Corporation, Tokyo, Japan

[22] Filed: Sept. 17, 1974

[21] Appl. No.: 506,691

[30] Foreign Application Priority Data
Sept. 28, 1973  Japan............................. 48-109119

[52] U.S. Cl. ................ 325/348; 325/478; 329/124
[51] Int. Cl.² ........................................... H04B 1/16
[58] Field of Search ............ 325/446, 448, 419, 420, 325/421, 422, 456, 478, 480; 329/50, 122, 124; 330/51

[56]  References Cited
UNITED STATES PATENTS

| | | |
|---|---|---|
| 3,100,871 | 8/1963 | Richardson et al................. 325/330 |
| 3,358,234 | 12/1967 | Stover.................................. 325/478 |
| 3,397,360 | 8/1968 | Kaneko et al................... 325/348 X |
| 3,541,449 | 11/1970 | Broderick et al................... 325/422 |

*Primary Examiner*—Benedict V. Safourek
*Attorney, Agent, or Firm*—Lewis H. Eslinger; Alvin Sinderbrand

[57]  ABSTRACT

A noise-squelching circuit in which a phase-locked loop supplies an identifiable output signal that distinguishes between those times when the voltage-controlled oscillator in the loop is locked onto an incoming carrier, and those times when it is not. This identifiable signal controls a muting circuit to allow the information modulated onto the incoming carrier to pass through the muting circuit to an output terminal only when the loop is locked to an incoming signal but not when the loop is not locked onto a carrier.

6 Claims, 2 Drawing Figures

NOISE-SQUELCHING CIRCUIT USING A PHASE-LOCKED LOOP

BACKGROUND OF THE INVENTION

1. Field of the Invention

This invention relates to a noise-squelcing circuit for use with a signal receiving system that includes a phase-locked loop for demodulation of incoming modulated carrier signals. More particularly, the invention is directed to a noise-squelching circuit for an amplitude modulation (AM) receiver with a phase-locked loop to provide a demodulation carrier, the loop also provides an output signal from a low pass filter to control a muting circuit and allow demodulated signals to pass through the muting circuit only when the signal from the filter indicates a phase-locked condition with respect to an incoming signal.

2. The Prior Art

AM receivers have been known heretofore in which a phase-locked loop is used as a demodulator. In such receivers a voltage controlled oscillator included in the phase-locked loop produces a reference carrier signal that is locked to the frequency of an incoming modulated carrier signal. The reference carrier signal is applied to a synchronous detector with the modulated carrier signal to effect demodulation of the incoming signal. It has also been known to provide a muting circuit in such receivers to mute the noise that would otherwise pass through the demodulator as the receiver was being tuned from one station to another. Such muting circuits have been provided at the demodulated output signal side of the demodulator and have been controlled by a signal obtained by rectifying the intermediate frequency (IF) signal in the receiver. However, such circuits cannot positively discriminate between a noise signal in the IF amplifier and an information signal. Furthermore, it is not easy to adjust the muting level of the muting circuit due to the fact that the level adjustment cannot be done smoothly.

Accordingly, it is one object of the present invention to provide a noise-squelching circuit that includes a phase-locked loop in the demodulation section of a receiver to provide an identifiable signal to control a muting circuit.

Another object of the invention is to provide an AM receiver with a demodulator that includes a phase-locked loop that produces a reference carrier signal for synchronous detection of an incoming signal and further includes a low pass filter that produces an identifiable output signal for use as a muting signal when the loop is in phase-locked condition with respect to an incoming carrier signal.

Further objects, features, and advantages of the present invention will be apparent from the following description taken in connection with the accompanying drawing.

SUMMARY OF THE INVENTION

IN accordance with the invention a phase-locked loop that includes a phase comparator, a voltage-controlled oscillator, and a low pass filter is connected to receive an incoming carrier signal at the phase comparator. In the customary way, the voltage-controlled oscillator is locked in step with the incoming carrier signal by means of a signal produced by the phase comparator and filtered by the low pass filter. The locked signal from the voltage-controlled oscillator is used as a local carrier signal and applied to a synchronous detector to detect the incoming modulated signal. The detected signal is filtered and applied to a muting circuit to control the latter to allow signals to pass therethrough only when the output signal of the filter is such as to indicate that the loop is in phase-locked condition. The output signal of the filter may be amplified and detected and its amplitude compared with a standard voltage to improve the control of the muting circuit.

DESCRIPTION OF THE PREFERRED EMBODIMENT

Before describing the present invention, the use of a phase-locked loop (PLL) in an AM receiver will be described.

If it is assumed that a carrier signal is expressed as $A_c \cos(\omega_c t + \theta_c)$, and a modulating signal by the expression $S(t)$, an amplitude modulated signal $E_m(t)$ may be expressed as follows:

$$E_m(t) = A_c[1 + S(t)] \cos(\omega_c t + \theta_c) \quad (1)$$

A reference carrier signal for synchronous detecting of the signal $E_m(t)$ is $E_o(t) = A_o \cos(\omega_o t + \theta_o)$, and the product $E_p(t)$ of the reference carrier signal $E_o(t)$ and the carrier signal $E_m(t)$ is expressed as follows:

$$E_p(t) = E_o(t) \times E_m(t) = \tfrac{1}{2} A_c A_o [1 + S(t)][\cos(\omega_c + \omega_o)t + \theta_c + \theta_o +_{cos}(\omega_c - \omega_o)t + \theta_c - \theta_o] \quad (2)$$

In equation (2), if $\omega_c = \omega_o$, the product $E_p(t)$ in equation (2) becomes:

$$E_p(t) = \tfrac{1}{2} A_c A_o [1 + S(t)] \cos(2\omega_c t + \theta_c + \theta_o) + \tfrac{1}{2} A_c A_o \cos(\theta_c - \theta_o) + \tfrac{1}{2} A_c A_o S(t) \cos(\theta_c - \theta_o) \quad (3)$$

In equation (3) the first term is an AM signal component with an angular frequency of $2\omega_c$, the second term is a DC component, and the third term includes the original signal $S(t)$.

If the product signal $E_p(t)$ is passed through a low pass filter that does not pass DC, the first and second terms can be eliminated so that the product signal $E_p(t)$ can be expressed by the following equation:

$$E_p(t) = \tfrac{1}{2} A_c A_o S(t) \cos(\theta_c - \theta_o) = k \cdot S(t) \quad (4)$$

where $k = \tfrac{1}{2} A_c A_o \cos(\theta_c - \theta_o)$, which is a constant. Thus, the original modulating signal $S(t)$ can be derived from the low pass filter. This corresponds to saying that if the AM signal $E_m(t)$ is multiplied by the signal $E_o(t)$ that has a frequency equal to the angular frequency $\omega_c$ of the carrier, and if the product signal $E_p(t)$ is passed through a low pass filter, the original modulating signal $S(t)$ can be recovered, or demodulated, from the carrier.

Figure 1:
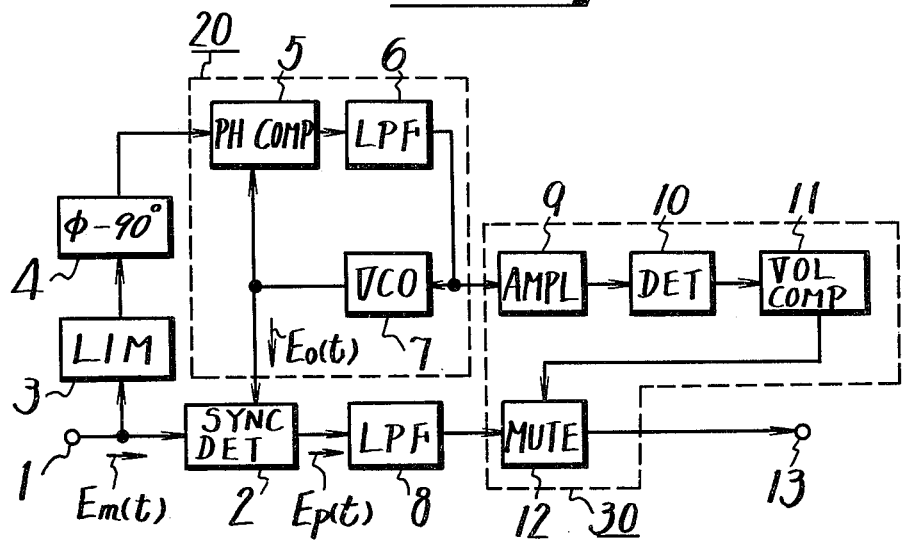
FIG. 1 is a block diagram showing an embodiment of a noise-squelching circuit based on an AM receiver and incorporating the features of the present invention.

FIG. 1 shows an embodiment of an AM receiver with a phase-locked loop to provide a local carrier for demodulation by means of synchronous detection and to provide a signal for controlling a muting circuit. The receiving system has an input terminal 1 to which a modulated carrier signal is applied, normally at the IF signal frequency. This incoming signal, which is the amplitude modulated signal $E_m(t)$, is applied to a multiplier circuit, or synchronous detector, 2 and to an amplitude limiter 3. By virtue of the limiting operation, the output signal of the limiter 3 includes the carrier frequency component at a substantially constant amplitude. The limiter 3 is connected to a phase shifter 4, the output of which is connected to a phase comparator 5 in a phase-locked loop 20. The output signal of the phase comparator 5 is connected to a low pass filter 6 that supplies this signal in filtered form to a voltage-controlled oscillator 7. The output of the oscillator 7 is connected to the phase comparator 5 and to the synchronous detector 2, as the signal $E_o(t)$. By virtue of the standard locking operation of the loop 20, the signal from the oscillator 7 has the same frequency as the signal $E_m(t)$, and the product of these signals in the synchronous detector 2 produces a product signal $E_p(t)$ to be applied to a low pass filter 8.

The output signal of the low pass filter 6 is also connected to an amplifier 9 in a control circuit 30. The amplifier 9 is connected to a detector 10 and the detector is connected to a voltage comparison circuit 11. The output of the voltage comparison circuit 11 is connected to a muting circuit 12 that also receives the demodulated, filtered signal from the low pass filter 8.

The muting circuit 12 is connected between the filter 8 and an output terminal 13.

Figure 2:
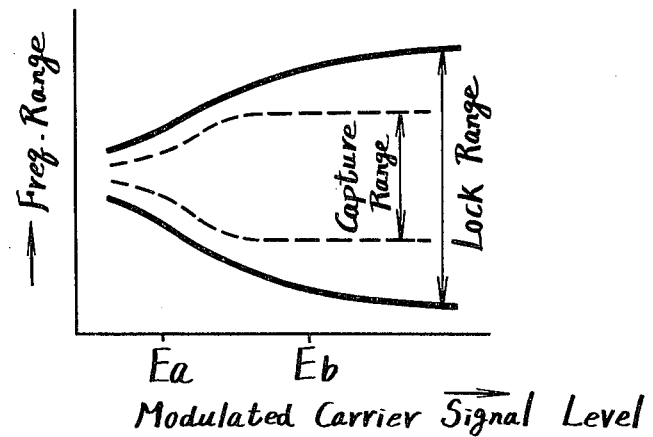
FIG. 2 is a graph used for explanation of the circuit in FIG. 1.

As the tuning of the receiver is changed in the customary way from the frequency of one station to another, the loop 20 is not in phase-locked condition because there is no incoming information signal between stations, only noise signals. However, when the receiver is tuned to the frequency of the next station, an incoming signal $E_m(t)$ is supplied with the angular frequency $\omega_c$ of the carrier of the incoming signal. According to the standard operation of phase-locked loops, the voltage controlled oscillator 7 is captured by the carrier frequency $\omega_c$ of the signal $E_m(t)$ so that the angular frequency $\omega_c$ of the oscillator 7 is locked into the angular frequency of the carrier of the signal $E_m(t)$. The frequency range within which the oscillation of the voltage controlled oscillator 7 can be captured by the carrier frequency of the signal $E_m(t)$ is called the capture range and, as is shown in FIG. 2, is wider if the amplitude of the signal $E_m(t)$ applied to the phase comparator 5 is high than if it is low. FIG. 2 shows both the capture range and the lock range. As may be seen, the lock range is greater than the capture range and is the range of frequencies over which the voltage controlled oscillator 7 will remain in lock once it has been captured.

If the phase-locked loop 20 is locked as a result of having the receiver tuned to an incoming carrier signal, no output signal is available from the low pass filter 6 because there is no phase difference between the incoming carrier signal and the signal from the oscillator 7. As a result, there is no signal through the amplifier 9 and the detector 10, and so the voltage comparison circuit 11 produces no output signal to make the muting circuit 12 nonconductive. Accordingly, the demodulated information signal from the incoming carrier as produced by the synchronous detector 2 and filtered by the low pass filter 8 is transmitted through the muting circuit 12 to the output terminal 13.

When the phase-locked loop 20 is not in its locked condition, there is a different signal condition at the output of the low pass filter 6. This different signal condition may be a beat signal between the signal of the oscillator 7 prior to locking and the incoming signal applied to the input terminal 1 and passed through the limiter 3 and phase shifter 4 to the phase comparator 5.

The beat signal is amplified by the amplifier 9 and detected by the detector 10 and applied to the voltage comparator 11. When the signal applied to the voltage detector 11 exceeds a predetermined value, it produces an output signal and applies this output signal to the muting circuit 12 to make the latter nonconductuve to signals from the low pass filter 8 so that such signals cannot reach the output terminal 13. In the absence of the locked state, the only signal that would be present at the terminal 13 would be a noise signal, which it is desired to squelch.

The amplitude limiter 3 causes the carrier signal component of the incoming signal to have a constant amplitude so that there is no modulated component in the output signal of the low pass filter 6. As a result, noise is eliminated in a stable manner when the receiver is de-tuned from a station. The limiter 3 also allows the capture and lock ranges of the phase-locked loop 20 to be constant and independent of the field strength of the incoming signals. This makes the tuning operation smoother. Furthermore, since the level of the modulated level applied to the phase-locked loop 20 is made constant, the output level of the signal from the phase-locked loop 20 does not vary with the strength of the incoming signal at the terminal 1. Thus, the muting level can be easily set.

Although this invention has been described with relation to a specific embodiment, it will be apparent to those skilled in the art that other embodiments can be used without departing from the true scope of the invention.

What is claimed is:

1. A noise-squelching circuit comprising:
   A. receiving means for receiving a modulated carrier signal within a predetermined frequency band;
   B. a phase-locked loop comprising a phase comparator, a low pass filter, and a voltage-controlled oscillator, said oscillator being controlled by an output signal from said filter to provide a carrier signal having a predetermined frequency related to the frequency of said modulated carrier signal when a modulated carrier signal is applied to said phase comparator;
   C. a demodulated signal path; and
   D. a muting circuit connected to said filter to be controlled by the output signal thereof and connected to said signal path to permit the passage of signals along said path only in response to a predetermined output signal level from said filter corresponding to a phase-locked condition of said loop.

2. The noise-squelching circuit of claim 1 in which said demodulated signal path comprises a synchronous detector connected to said receiving means for receiving a modulated carrier signal and connected to said voltage-controlled oscillator to receive a reference carrier signal therefrom to produce a demodulated output signal.

3. The noise-squelching circuit of claim 2 in which said receiving means comprises a phase-shifting circuit having an output connected to said phase comparator to transmit said amplitude modulated carrier signal to said comparator to equalize the phase difference between the modulated carrier signal and the reference carrier signal from said volage controlled oscillator.

4. The noise-squelching circuit of claim 2 comprising, in addition:
   A. an amplitude detector connected to said low pass filter to be energized by output signals therefrom;

and

B. a voltage comparison circuit connected to said amplitude detector to compare the output voltage thereof with a standard voltage to produce a muting control signal, said voltage comparison circuit being connected to said muting circuit to apply said control signal thereto.

5. The noise-squelching circuit of claim 2 comprising, in addition, a second low pass filter connected to the output of said synchronous detector.

6. The noise-squelching circuit of claim 2 in which said receiving means comprises an amplitude limiter having an output connected to said phase comparator to transmit said amplitude modulated carrier signal to said comparator at a substantially constant level, whereby the output signal of said low pass filter can maintain a substantially constant level in the phase-locked condition of said loop.

* * * * *